United States Patent
Graham et al.

(10) Patent No.: US 9,127,981 B2
(45) Date of Patent: Sep. 8, 2015

(54) SYSTEM AND METHOD FOR RETURN BEAM METROLOGY WITH OPTICAL SWITCH

(71) Applicant: Cymer, LLC, San Diego, CA (US)

(72) Inventors: Matthew Graham, San Diego, CA (US); Robert Bergstedt, Carlsbad, CA (US); Steven Chang, San Diego, CA (US)

(73) Assignee: Cymer, LLC, San Diego, CA (US)

( * ) Notice: Subject to any disclaimer, the term of this patent is extended or adjusted under 35 U.S.C. 154(b) by 209 days.

(21) Appl. No.: 13/960,090

(22) Filed: Aug. 6, 2013

(65) Prior Publication Data

US 2015/0041659 A1    Feb. 12, 2015

(51) Int. Cl.
*G01J 1/04* (2006.01)
*H05G 2/00* (2006.01)
*H01L 21/027* (2006.01)
*G03F 7/20* (2006.01)

(52) U.S. Cl.
CPC .............. *G01J 1/0448* (2013.01); *H05G 2/008* (2013.01); *G03F 7/2002* (2013.01); *H01L 21/027* (2013.01)

(58) Field of Classification Search
CPC ....... G03F 7/20; G03F 7/2002; G03F 7/2037; G03F 7/2039; H05G 2/008; H01L 21/027
See application file for complete search history.

(56) References Cited

U.S. PATENT DOCUMENTS

| | | | | |
|---|---|---|---|---|
| 4,994,991 A | * | 2/1991 | Richman | 702/1 |
| 6,819,815 B1 | * | 11/2004 | Corbalis et al. | 385/16 |
| 8,598,552 B1 | * | 12/2013 | Frihauf et al. | 250/504 R |
| 8,872,144 B1 | * | 10/2014 | Fomenkov | 250/504 R |
| 2010/0258750 A1 | * | 10/2010 | Partlo et al. | 250/504 R |
| 2013/0119232 A1 | | 5/2013 | Moriya et al. | |

FOREIGN PATENT DOCUMENTS

| | | |
|---|---|---|
| EP | 2009485 A1 | 12/2008 |
| WO | 2012/031841 A1 | 3/2012 |

* cited by examiner

*Primary Examiner* — Casey Bryant
(74) *Attorney, Agent, or Firm* — Gard & Kaslow LLP (57) ABSTRACT

Extreme ultraviolet light (EUV) is produced in a laser-produced plasma (LPP) EUV light source when laser light strikes a target. Measuring reflected light from the target by a Return Beam Diagnostics (RBD) module provides data on EUV production, including but not limited to target position, target focus, target shape, and target profile. In a RBD module, a controller sequences an optical switch to direct the reflected light between a blocking element and a sensing device, providing greater flexibility in measuring the reflected light during different aspects of the EUV generation process, such as different power levels and duty cycles of the laser light striking the target.

18 Claims, 6 Drawing Sheets

SYSTEM AND METHOD FOR RETURN BEAM METROLOGY WITH OPTICAL SWITCH

BACKGROUND OF THE INVENTION

1. Field of the Invention

The present invention relates generally to laser technology for photolithography, and, more particularly, to optimization of extreme ultraviolet (EUV) light production.

2. Description of the Prior Art

The semiconductor industry continues to develop lithographic technologies which are able to print ever-smaller integrated circuit dimensions. Extreme ultraviolet (EUV) light (also sometimes referred to as soft x-rays) is generally defined to be electromagnetic radiation having wavelengths of between 10 and 110 nanometers (nm). EUV lithography is generally considered to include EUV light at wavelengths in the range of 10-14 nm, and is used to produce extremely small features (e.g., sub-32 nm features) in substrates such as silicon wafers. These systems must be highly reliable and provide cost-effective throughput and reasonable process latitude.

Methods to produce EUV light include, but are not necessarily limited to, converting a material into a plasma state that has one or more elements (e.g., xenon, lithium, tin, indium, antimony, tellurium, aluminum, etc.) with one or more emission line(s) in the EUV range. In one such method, often termed laser-produced plasma (LPP), the required plasma can be produced by irradiating a target, such as a droplet, stream or cluster of material having the desired spectral line-emitting element, with a laser beam at an irradiation site.

The spectral line-emitting element may be in pure form or alloy form (e.g., an alloy that is a liquid at desired temperatures), or may be mixed or dispersed with another material such as a liquid. This target is delivered to a desired irradiation site (e.g., a primary focal spot) and illuminated by a laser source within an LPP EUV source plasma chamber for plasma initiation and the generation of EUV light. It is necessary for the laser beam, such as from a high power $CO_2$ laser source, to be focused on a position through which the target will pass and timed so as to intersect the target material when it passes through that position in order to hit the target properly to obtain a good plasma, and thus, good EUV light.

Return beam metrology is used with the EUV source to view the process of generating EUV light, for example, viewing and measuring the light reflected from the target as the target is illuminated by the laser source. Such measurements are referred to as Return Beam Diagnostics (RBD). These return beam diagnostics may include measurements of target position and shape, effectiveness of laser source illumination, laser source focus, and the like.

These RBD measurements are made by a sensing device such as a camera, infrared detector, or microbolometer responsive to the wavelength of the laser source. Due to the operating principle of these sensing devices, their exposure to the reflected light should be controlled when measurements are to be made.

One known method of limiting sensing device exposure to the reflected light is through the use of a mechanical interrupter, such as a set of opaque rotating vanes which periodically block the optical path to the sensing device. The geometry and rotating speed of the vanes defines fixed on and off times, with the spacing between the vanes and the rotating speed defining the on time where a clear optical path is provided for the reflected light to reach the sensing device, and the width of the opaque vanes and the rotating speed defining the off time where the reflected light is blocked from reaching the sensing device.

Because the interrupter defines the times where measurements are made, the fixed nature of such an interrupter imposes limitations in its use with the laser source. Interrupter on and off times are not easily changeable on a measurement to measurement basis. Therefore, it is difficult to maintain synchronization between the interrupter and a pulsed laser source under different operating conditions. Synchronization is needed to insure the reflected light reaches the sensor at approximately the center of the exposure period, so that the sensing device is fully illuminated by the reflected light. Measurements taken when the sensing device is partially occluded by a vane will produce erroneous readings.

What is needed, therefore, is an improved way to control the reflected light reaching a sensing device for making return beam diagnostic measurements in an EUV source.

SUMMARY

In an embodiment is presented a method for measuring light reflected from a target in a laser produced plasma extreme ultraviolet light source, the method comprising: (a) receiving the reflected light at an optical switch; (b) directing the received reflected light, by the optical switch, along a first optical output path from the optical switch to a light blocking element; (c) receiving a first laser source firing signal at a controller; (d) communicating, in response to the received first laser source firing signal, a signal from the controller to the optical switch to direct the received reflected light along a second optical output path from the optical switch to a sensing device; (e) measuring the received reflected light by the sensing device; (f) communicating, after a first predetermined period of time following step (d), a signal from the controller to the optical switch to direct the received reflected light along the first optical output path from the optical switch to the light blocking element; and (g) receiving a second laser source firing signal at the controller and if the second laser source firing signal is received at the controller after the first predetermined period of time plus a second predetermined period of time, then repeating steps (d) through (f) wherein step (d) is in response to the second laser source firing signal, else ignoring the second laser source firing signal received at the controller.

In an embodiment, the first predetermined time and the second predetermined time are determined by a duty cycle of the laser source.

In an embodiment is presented a return beam diagnostics system for measuring light reflected from a target in a laser produced plasma extreme ultraviolet light source, comprising: an optical switch located on an optical input path that receives the light reflected from the target when the target is illuminated by a laser source, the optical switch configured to have a first state directing the received reflected light from the optical switch on a first optical output path, the optical switch configured to have a second state directing the received reflected light from the optical switch on a second optical output path, a light blocking element located on the first optical output path, a sensing device located on the second optical output path, the sensing device configured to measure the received reflected light, and a controller configured to respond to a first laser source firing signal by directing the optical switch to perform a measurement sequence of: changing from the first state to the second state, thereby directing the received reflected light from the optical switch along the second optical output path to the sensing device for measurement, and changing from the second state to the first state after a first predetermined period of time, the controller further configured to responding to a second laser source firing signal by repeating the measurement sequence if the second laser source firing signal is received at the controller after the first predetermined period of time plus the second predetermined period of time, else ignoring the second laser source firing signal received at the controller.

DETAILED DESCRIPTION OF THE INVENTION

In an extreme ultraviolet (EUV) light source, EUV light is produced by converting a target to a plasma by irradiating the target with a laser from a laser source. Such an EUV source is termed a laser-produced plasma (LPP) EUV source. LPP EUV sources are used, for example, in photolithography for producing integrated circuits, as a component in a larger photolithography system.

Return beam metrology is used in the EUV source to measure the process of generating EUV light, for example, measuring a reflected light from the target as the target is illuminated by the laser source. Such measurements are referred to as Return Beam Diagnostics (RBD). These return beam diagnostics may include measurements of target position and shape, effectiveness of laser source illumination, laser source focus, and the like.

To make these measurements, the reflected light from the target illuminated by the laser source is directed to an RBD module.

In an embodiment of an RBD module, the reflected light is measured by a sensing device such as an infrared camera, microbolometer array, pyrocam, quad sensor, charge coupled imager, or other suitable detector responsive to the wavelength of the laser source, which produces a two-dimensional representation of the reflected light. As the sensing device is thermal in nature, the sensing device heats up as it is exposed to the reflected light for a first predetermined period of time, the exposure time. After this exposure time, the measurement is made by the sensing device. The sensing device is then allowed to recover to a pre-exposure state for at least a second predetermined period of time, the recovery time. A controller in response to a laser firing signal from the laser source sequences an optical switch so that the reflected light is directed to the sensing device for the exposure time, and then directed to a blocking element for at least the recovery time.

Once the recovery time has passed, another measurement sequence is then initiated by the controller in response to a second laser source firing signal from the laser source. In contrast, a second laser source firing signal received within the exposure plus recovery time is ignored.

By having the controller sequence the optical switch in response to the firing signal from the laser source, the RBD module has greater flexibility in controlling or regulating the measurement of the reflected light, for example, by varying the exposure of the sensing device to the reflected light as the duty cycle of the laser source changes. As is known in the art, the duty cycle is the period of time the laser source is active in relation to the overall period, ranging from a low duty cycle, to a high duty cycle, to continuous wave operation where the laser source is firing continuously.

As the sensing device is thermal in nature, too long an exposure time results in sensor saturation, producing inaccurate measurements. The controller sequencing the optical switch can vary both the exposure time and the recovery time in response to changing conditions, for example in changes to power levels of the laser source or in changes to the environmental state of the sensing device, such as its operating temperature.

In an embodiment of the RBD module, the reflected light is received by the optical switch located on an optical input path. In a first state, the optical switch directs the reflected light along a first optical output path from the optical switch to a blocking element. In a second state, the optical switch directs the reflected light along a second optical output path from the optical switch to the sensing device for measurement.

A lens may be placed in the optical path to focus the reflected light on the sensing device; the lens may be placed on the second optical output path, or on the optical input path to the optical switch.

The optical switch is operated by the controller in response to a first laser source firing signal. In response to the first laser source firing signal, the controller directs the optical switch to begin a measurement sequence by changing from the first state to the second state, directing the reflected light from the optical switch along the second optical output path to the sensing device for measurement. After a first predetermined exposure time, the controller directs the optical switch to change back to the first state, directing the reflected light from the optical switch to the blocking element. The controller responds to a second laser source firing signal by repeating the measurement sequence if the second laser source firing signal is received at the controller after the first predetermined exposure time plus the second predetermined recovery time, otherwise the second laser source firing signal is ignored.

Through this sequencing of the optical switch, the controller selects what portion of the reflected light is measured by the sensing device. These first and second predetermined times may change according to the duty cycle of the laser source. In one embodiment, a mathematical function maps an estimate of the duty cycle of the laser source to the first and second predetermined times. In another embodiment, a lookup table containing predetermined entries may be used, with entries containing the first and second predetermined times, and indexed by the estimated duty cycle of the laser source.

During the first exposure time the reflected light is directed from the optical switch to the sensing device.

During the second recovery time, following the exposure time, the reflected light is directed from the optical switch to the blocking element. In an embodiment, during the recovery time data is read from the sensing device for processing, and the sensing device recovers for another measurement sequence.

Figure 1:
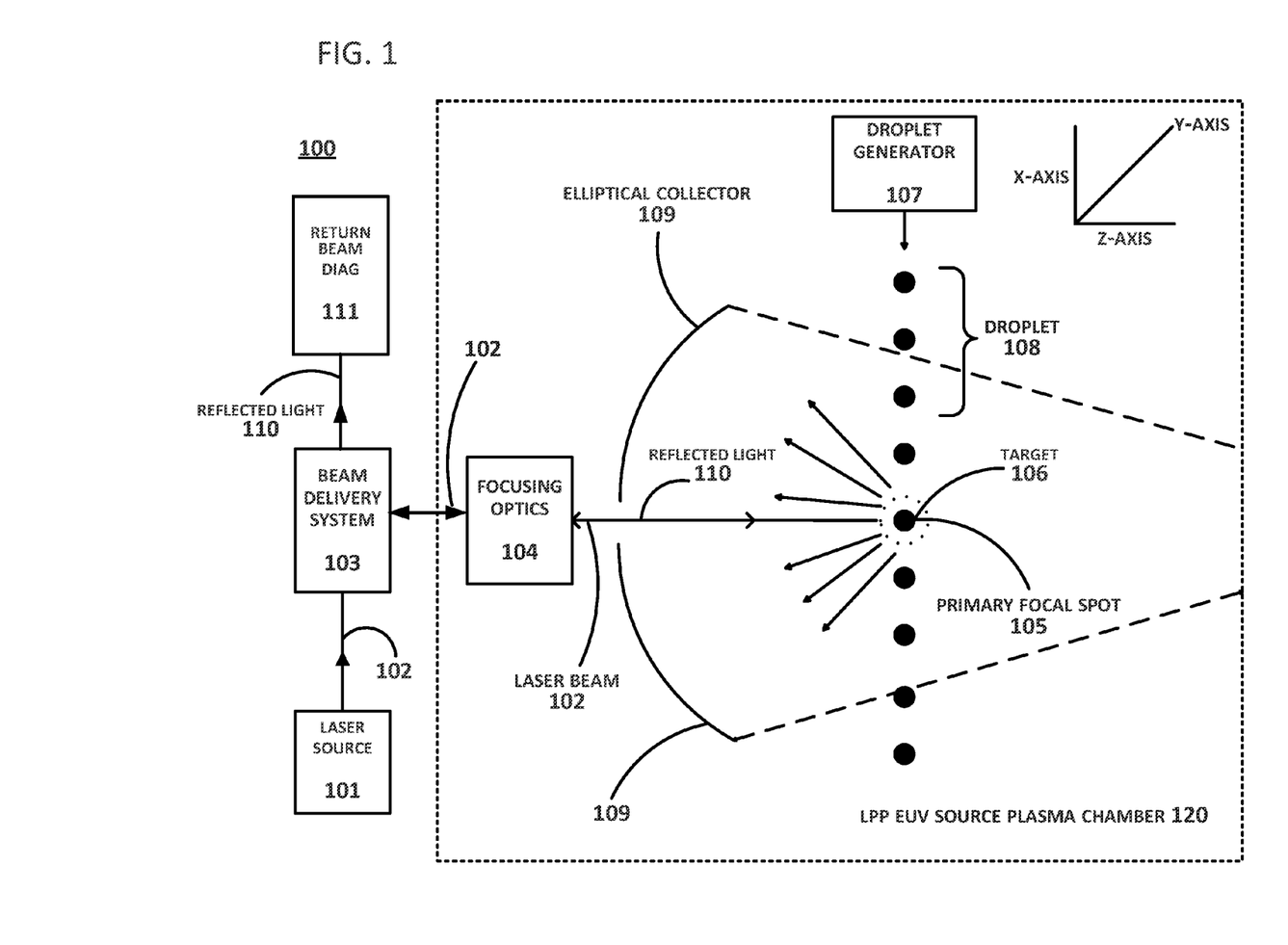
FIG. 1 is a schematic illustrating some of the components of a typical LPP EUV system in which the present approach may be used.

FIG. 1 illustrates some of the components of a typical LPP EUV system 100. A laser source 101, such as a high power $CO_2$ laser, produces a laser beam 102 that passes through a beam delivery system 103 and through focusing optics 104. Focusing optics 104 have a primary focal spot 105 at an irradiation site within an LPP EUV source plasma chamber 120, irradiating a target 106. A droplet generator 107 produces and ejects target droplets 108 of an appropriate target material. When irradiated by laser beam 102 at the irradiation site, target 106 produces plasma that emits EUV light. An elliptical collector 109 focuses the EUV light from the plasma for delivering the produced EUV light to, e.g., a lithography system, not shown. In some embodiments, there may be multiple laser sources 101, with beams that all converge on focusing optics 104. One type of LPP EUV light source may use a $CO_2$ laser and a zinc selenide (ZnSe) lens with an anti-reflective coating and a clear aperture of about 6 to 8 inches.

Figure 2:
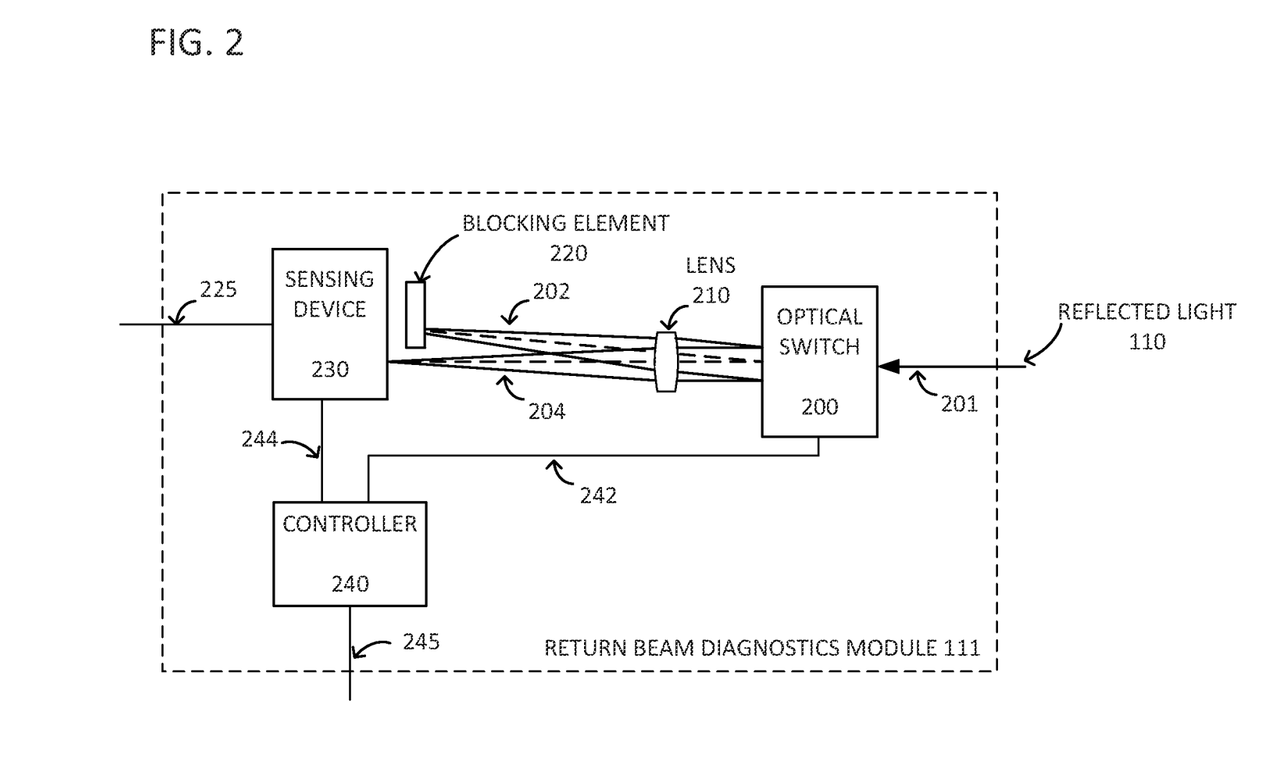
FIG. 2 is a diagram of a return beam diagnostics module according to an embodiment.

To measure the EUV generation process, a reflected light 110 from target 106 is directed to return beam diagnostics (RBD) module 111, shown in more detail in FIG. 2. In one embodiment, as shown in FIG. 1, the reflected light 110 passes through focusing optics 104. Reflected light 110 is directed to RBD module 111; reflected light 110 may pass through beam delivery system 103, or may be directed separately from beam delivery system 103 such as through the use of mirrors, beam splitters, or other techniques known to the art.

Turning now to FIG. 2, RBD module 111 according to an embodiment is shown. Reflected light 110 (from target 106 of FIG. 1) is received by optical switch 200 along an optical input path 201 from target 106 in LPP EUV source plasma chamber 120.

In a first state, optical switch 200 directs reflected light 110 on a first optical output path 202 to a blocking element 220.

In a second state, optical switch 200 directs reflected light 110 on a second optical output path 204 to a sensing device 230.

In one embodiment, an acousto-optical switch such as a Bragg cell is used for optical switch 200. As is known in the art, the light deflection introduced by a Bragg cell is a function of a switching signal imposed across the cell.

While an acousto-optical switch such as a Bragg cell is used in one embodiment for optical switch 200, other technologies may be used in other embodiments, such as other forms of acousto-optic modulators, electro-optic modulators, microelectromechanical (MEMS) mirrors, or electro-mechanical switches.

Blocking element 220 receives reflected light 110 along first optical output path 202 when optical switch 200 is in the first state. In an embodiment, blocking element 220 is an optical block such as a heat sink with a nonreflective surface.

In an alternative embodiment, blocking element 220 may be an optical power sensor such as an optical power meter or photoelectromagnetic (PEM) detector.

In an alternative embodiment, blocking element 220 may be a portion of sensing device 230 not used for measuring reflected light 110, for example, an unused portion of a sensing element, or a portion of the enclosure of sensing device 230.

When optical switch 200 is in the second state, reflected light 110 is directed on second optical output path 204 to sensing device 230 for measurement.

In an embodiment, sensing device 230 is an infrared detector such as an infrared camera, microbolometer array, or pyrocam, which produces a two-dimensional representation of reflected light 110. Sensing device 230 measures reflected light 110, sending measured data and accepting control commands on path 225 for example from controller 240 or a measurement or control computer (not shown). Path 225 may be any suitable data link for the type of sensing device 230 used. Examples include serial or parallel links, Universal Serial Bus (USB, USB3), IEEE1394/FireWire®, Ethernet, or other suitable data link.

In an embodiment, a lens 210 is placed on second optical output path 204 between optical switch 200 and sensing device 230 to focus reflected light 110 on sensing device 230 when optical switch 200 is in the second state. In an alternative embodiment, lens 210 may be placed on the optical input path 201 to optical switch 200.

Controller 240 is coupled to receive a laser source firing signal 245. In an embodiment, laser source firing signal 245 may be produced by laser source 101, or by a photolithography system which uses LPP EUV system 100. In response to a first laser source firing signal 245, controller 240 changes optical switch 200 from the first state in which reflected light 110 is directed along first optical output path 202 to blocking element 220, to the second state in which reflected light 110 is directed along second optical output path 204 to sensing device 230, beginning a measurement sequence. After the first predetermined period of time, the exposure time, from changing optical switch 200 to the second state, controller 240 changes optical switch 230 to the first state where reflected light 110 is again directed along first optical output path 202 to blocking element 220. After changing optical switch 200 from the second state to the first state, a second laser source firing signal 245 is received at controller 240. If the second laser source firing signal 245 is received at controller 240 after the first predetermined exposure time plus the second predetermined recovery time, another measurement sequence is performed, otherwise the second laser source firing signal is ignored.

Figure 3:
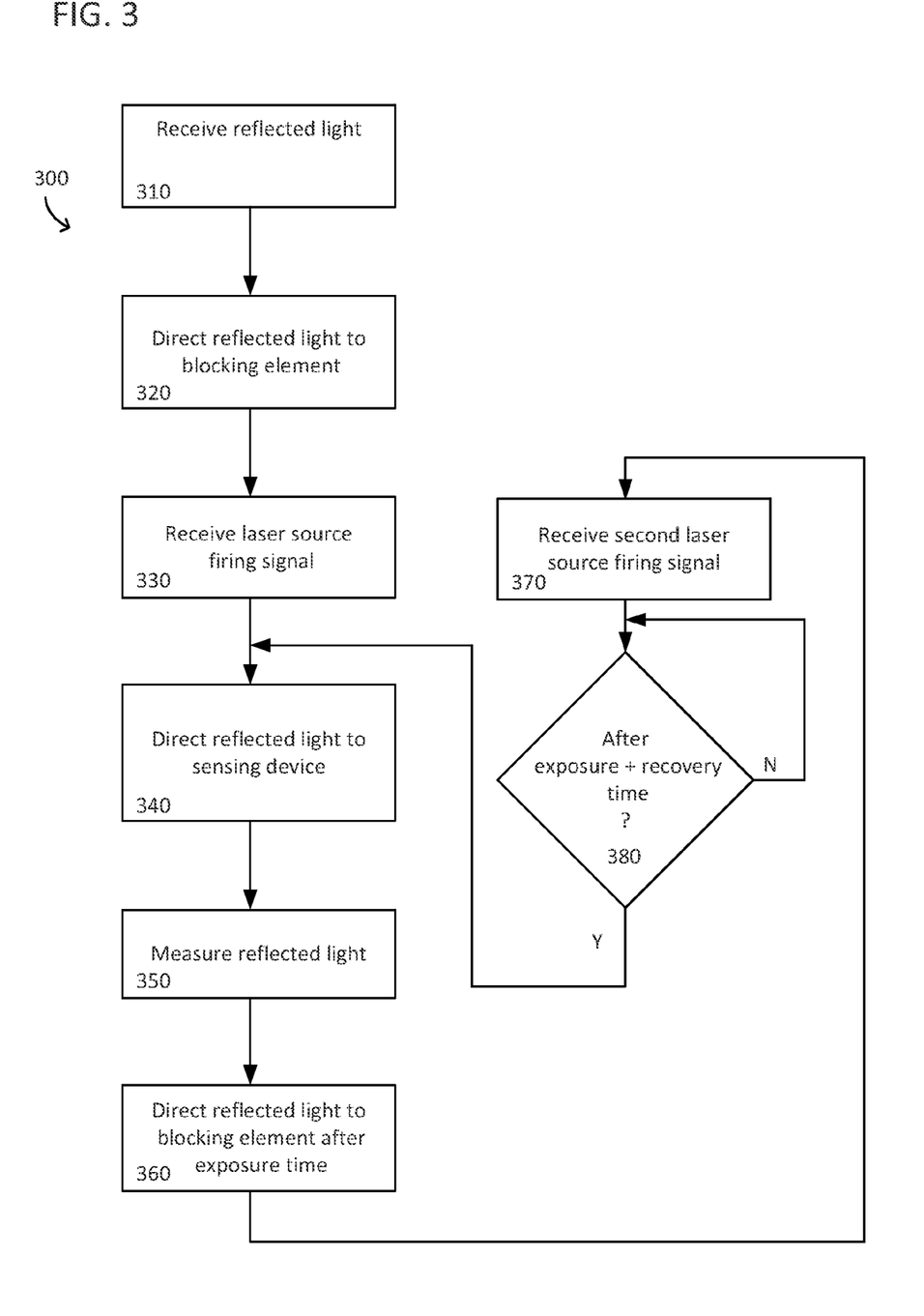
FIG. 3 is a flowchart of the operation of a return beam diagnostics module according to an embodiment

An embodiment of this measurement method is shown in the flowchart of FIG. 3.

In step 310, reflected light is received at the optical switch. In an embodiment, reflected light 110 is received at optical switch 200.

In step 320, the received reflected light is directed to a light blocking element. In an embodiment, optical switch 200 directs reflected light 110 along first optical output path 202 to light blocking element 220. In an embodiment, this step is performed as part of an initialization sequence of RBD diagnostics module 111. In another embodiment, the design of optical switch 200 directs reflected light 110 along first optical output path 202 when optical switch 200 is in a default state.

In step 330, the laser source firing signal is received by the controller. In an embodiment, controller 240 receives laser source firing signal 245.

In step 340, received reflected light is directed to the sensing device. In an embodiment, optical switch 200 receives signal 242 from controller 240 in response to laser source firing signal 245, directing received light 110 along second optical output path 204 to sensing device 230.

In step 350, the received reflected light is measured. In an embodiment, sensing device 230 measures the reflected light 110 received on the second optical path 204.

In step 360, after a first predetermined period of time following step 340, the received reflected light is directed to the blocking element. In an embodiment, after the first predetermined period of time, the exposure time, controller 240 signals 242 optical switch 200 to direct reflected light 110 along first optical path 202 to light blocking element 220. This step may overlap step 350, with the measurement by sensing device 230 commencing after the predetermined first exposure time.

In step 370, after performing step 360, a second laser source firing signal is received at the controller. In an embodiment, controller 240 receives a second laser source firing signal 245.

In step 380, if the second laser source firing signal is received at the controller after the first predetermined period of time, the exposure time, plus a second predetermined period of time, the recovery time, then the process continues by repeating steps 340 through 360 wherein step 340 is in response to the second laser source firing signal. In an embodiment, the second laser source firing signal 245 begins another measurement sequence by controller 240 with step 340 only if the second laser source firing signal 245 is received after the exposure time plus the recovery time.

Alternatively, in step 380, if the second laser source firing signal is received within the first predetermined period of time, the exposure time, plus the second predetermined period of time, the recovery time, the second laser source firing signal is ignored. In an embodiment, second laser source firing signal 245 is ignored by controller 240 if second laser source firing signal 245 is received within the exposure time plus the recovery time.

As is known, in the operation of EUV light source 100, the output power of the EUV light can be varied by varying the duty cycle of laser source 101, that is, the amount of time in a given interval that laser source 101 is firing, resulting in the production of EUV light. This duty cycle can vary from low, such as shown by laser source firing signal 245 in FIG. 4a, where laser source 101 is firing infrequently, to a high duty cycle such as shown by laser source firing signal 245 in FIG. 4b, where laser source 101 is firing rapidly, to continuous mode operation as shown by laser source firing signal 245 in FIG. 4c, where laser source 101 is firing continuously.

Figure 4A:
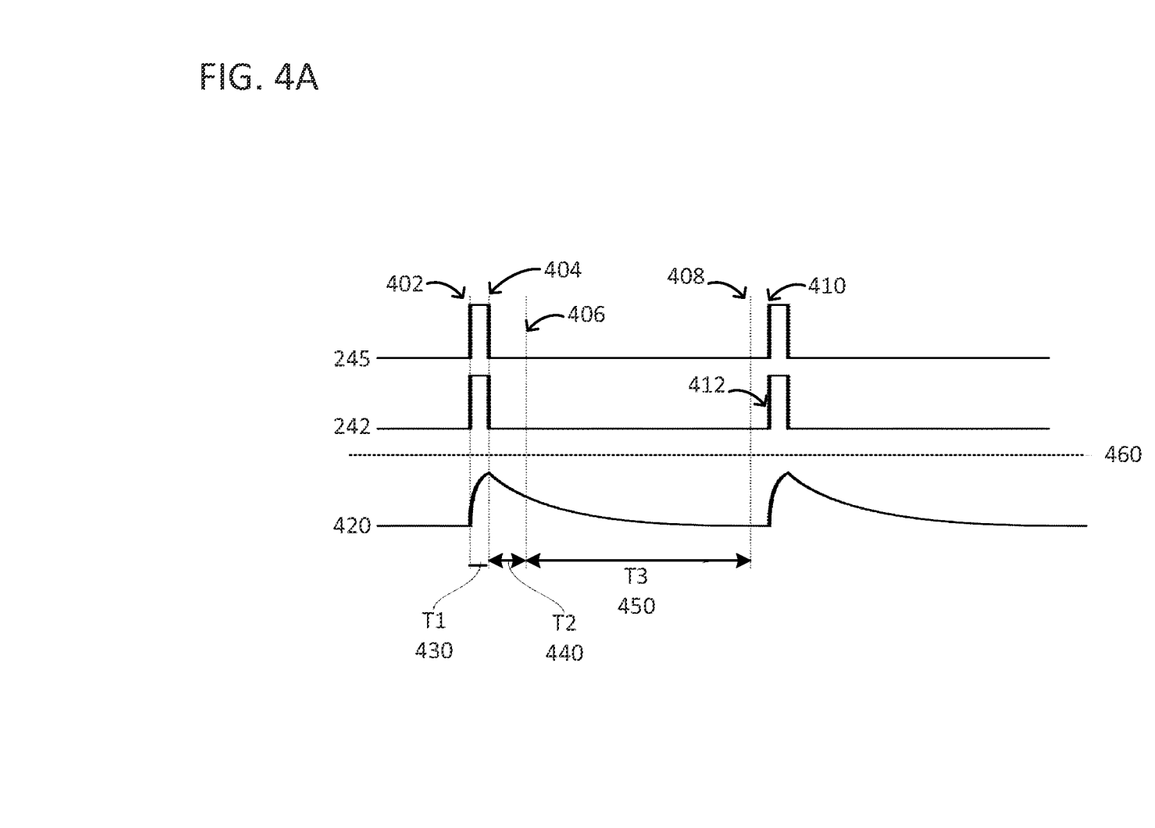
FIG. 4a is a graph of the operation of a return beam diagnostics module in a low duty cycle mode according to an embodiment.

Referring now to FIG. 4a, the operation of RBD module 111 in a low duty-cycle laser source firing mode according to an embodiment is shown. Laser source firing signal 245 transitions from a low level to a high level at time 402 signaling the firing of laser source 101 of FIG. 1. Laser source firing signal 245 transitions low at time 404, signaling the end of the laser pulse.

In an embodiment, in response to the first laser source firing signal 402, controller 240 signals 242 optical switch 200 to direct reflected light 110 to sensing device 230, beginning the measurement sequence.

After controller 240 signals 242 optical switch 200 to direct reflected light 110 to sensing device 230 for measurement, controller 240 signals 242 optical switch 200 to direct reflected light 110 to light blocking element 220 after the first predetermined exposure time. In an embodiment, optical switch 200 remains in the second state for the first predetermined exposure time, from time 402 to time 404, denoted as time T1 430.

In an embodiment, at the completion of first predetermined exposure time T1 430, controller 240 changes optical switch 200 from the second state to the first state, directing reflected light 110 away from sensing device 230 and along first optical output path 202 to blocking element 220.

If a second laser source firing signal is received at controller 240 after the first predetermined exposure time plus the second predetermined recovery time, another measurement sequence is begun, else the second laser source firing signal is ignored. As shown, second laser source firing signal 410 is received after the first predetermined exposure time plus the second predetermined recovery time, and another measurement sequence is begun, shown by controller 240 signaling 412 optical switch 200 to direct reflected light 110 to sensing device 230.

The response of sensing device 230 in measuring the reflected light is shown as line 420. In an embodiment, the response of sensing device 230 may be modeled using exponential charge/discharge characteristics known to the electronic arts. When exposed to reflected light 110 during exposure time T1 430, sensing device 230 heats up exponentially. When exposure time T1 430 ends at time 404, sensing device 230 is read out during a measurement time T2 440. During this measurement time T2 440, sensing device 230 cools down. This cool down process is modeled as an exponential process, which continues through time T3 450. This recovery time, time T2 440 plus time T3 450, returns sensing device 230 to a state where another measurement sequence may be made. Note that the recovery time may be longer without significantly changing measurements made by sensing device 230.

In an embodiment, exposure time T1 430 is predetermined to prevent sensing device 230 from saturation. A saturation level is shown as line 460 of FIG. 4a. An exposure time T1 which is too long results in saturation of sensing device 230, which in turn results in a loss of accuracy in measurements. Extreme saturation could result in damage to sensing device 230. Conversely, too short an exposure time T1 results in unused dynamic range of sensing device 230. Therefore, in an embodiment, the exposure time is selected to make best use of the dynamic range of sensing device 230 without undue saturation.

In an embodiment, exposure time T1 may be fixed so that saturation of sensing device 230 does not occur under planned operation. In another embodiment, exposure time T1 is adjusted so that maximum pixel values sensed by sensing element 230 are within a predetermined value of a saturation level. In another embodiment, exposure time T1 is adjusted so that no more than a predetermined number or percentage of pixels in sensing device 230 are saturated.

Similarly, recovery time T2+T3 may be fixed, for example during manufacturing of RBD module 111. In another embodiment, recovery time T2+T3 is adjusted, by varying T3, keeping measurement time T2 440 fixed. As an example, the recovery time T2+T3 may be adjusted to account for environmental factors such as the operating temperature of RBD module 111 and sensing device 230. Recovery time T2+T3 may be adjusted based on the peak values measured by sensing device 230, for example by determining a recovery time required for sensing device 230 to recover from peak values to values permitting a subsequent measurement cycle. As an example, for a particular sensing device, exposure time T1 is approximately 10 milliseconds, and recovery time T2+T3 is approximately 10 milliseconds; using a different sensing device, exposure time T1 is approximately 1 millisecond, with recovery time T2+T3 approximately 5 milliseconds.

Figure 4B:
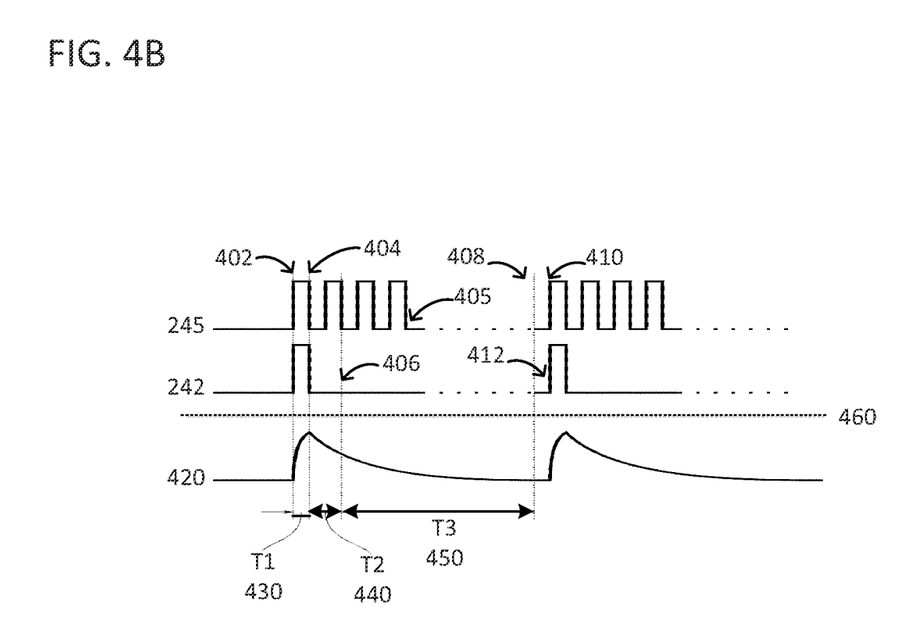
FIG. 4b is a graph of the operation of a return beam diagnostics module in a high duty cycle mode according to an embodiment.

Referring now to FIG. 4b, the operation of RBD module 111 in a high duty-cycle laser source firing mode according to an embodiment is shown. While laser source firing signal 402 transitions from low to high to low to high over a series of pulses 405, control signal 242 from controller 240 directs optical switch 200 from the first state to the second state, beginning the measurement sequence. After the first predetermined exposure time T1 430 from beginning the measurement sequence, controller 200 directs control signal 242 and optical switch 200 to the first state for the recovery time, time T2 440 plus time T3 450.

If the second laser source firing signal is received at controller 240 after the first predetermined exposure time T1 430 plus the second predetermined recovery time T2 440, plus time T3 450, another measurement sequence is begun, else the second laser source firing signal is ignored.

Additional laser source firing signals 245 that occur during the first predetermined exposure time T1 430 plus the second predetermined recovery time T2 440 plus time T3 450, and are ignored. In contrast, laser source firing signal 410 follows the first predetermined exposure time T1 430 plus the second predetermined recovery time T2 440 plus time T3 450, at time 408, and another measurement sequence is begun, shown by controller 240 signaling 412 optical switch 200 to direct reflected light 110 to sensing device 230.

Figure 4C:
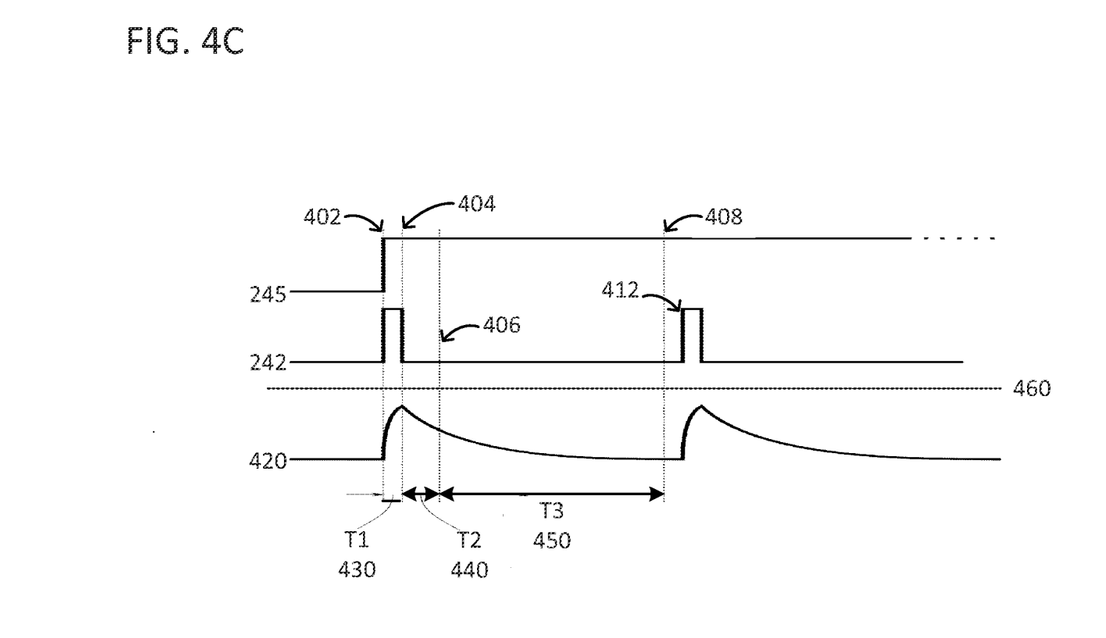
FIG. 4c is a graph of the operation of a return beam diagnostics module in a continuous wave mode according to an embodiment.

Referring now to FIG. 4*c*, the operation of the RBD module 111 in a continuous wave laser source firing mode is shown. When laser source 101 of FIG. 1 is firing in a continuous wave mode, as indicated by laser source firing signal 300 transitioning high at 302 and remaining high, controller 240 sequences optical switch control signal 245 in a similar manner as in the high duty cycle mode described with reference to FIG. 4*b*. Once the first predetermined exposure time T1 430 plus the second predetermined recovery time T2 440 plus time T3 450, has completed at time 408, with laser source firing signal 245 still high, and another measurement sequence is begun, shown by controller 240 signaling 412 optical switch 200 to direct reflected light 110 to sensing device 230.

It should be noted that while the disclosed method and apparatus have been explained with respect to return beam diagnostics based on infrared laser sources, other laser sources may also be used, such as in the one micrometer wavelength or shorter, in conjunction with sensing devices which are responsive to the wavelength of the source laser used.

The disclosed method and apparatus have been explained above with reference to several embodiments. Other embodiments will be apparent to those skilled in the art in light of this disclosure. Certain aspects of the described method and apparatus may readily be implemented using configurations other than those described in the embodiments above, or in conjunction with elements other than those described above. For example, different algorithms and/or logic circuits, perhaps more complex than those described herein, may be used, as well as possibly different types of laser sources, optical paths, and/or focus lenses.

Further, it should also be appreciated that the described method and apparatus can be implemented in numerous ways, including as a process, an apparatus, or a system. The methods described herein may be implemented by program instructions for instructing a processor such as controller 240 to perform such methods, and such instructions recorded on a nontransitory computer readable storage medium such as a hard disk drive, floppy disk, optical disc such as a compact disc (CD) or digital versatile disc (DVD), flash memory, etc., or a computer network wherein the program instructions are sent over optical or electronic communication links. It should be noted that the order of the steps of the methods described herein may be altered and still be within the scope of the disclosure.

It is to be understood that the examples given are for illustrative purposes only and may be extended to other implementations and embodiments with different conventions and techniques. While a number of embodiments are described, there is no intent to limit the disclosure to the embodiment(s) disclosed herein. On the contrary, the intent is to cover all alternatives, modifications, and equivalents apparent to those familiar with the art.

In the foregoing specification, the invention is described with reference to specific embodiments thereof, but those skilled in the art will recognize that the invention is not limited thereto. Various features and aspects of the above-described invention may be used individually or jointly. Further, the invention can be utilized in any number of environments and applications beyond those described herein without departing from the broader spirit and scope of the specification. The specification and drawings are, accordingly, to be regarded as illustrative rather than restrictive. It will be recognized that the terms "comprising," "including," and "having," as used herein, are specifically intended to be read as open-ended terms of art.

What is claimed is:

1. A return beam diagnostics system for measuring light reflected from a target in a laser produced plasma extreme ultraviolet light source, comprising:
    an optical switch located on an optical input path that receives the light reflected from the target when the target is illuminated by a laser source,
        the optical switch configured to have a first state directing the received reflected light from the optical switch on a first optical output path,
        the optical switch configured to have a second state directing the received reflected light from the optical switch on a second optical output path;
    a light blocking element located on the first optical output path;
    a sensing device located on the second optical output path, the sensing device configured to measure the received reflected light; and
    a controller configured to respond to a first laser source firing signal by directing the optical switch to perform a measurement sequence of:
        changing from the first state to the second state, thereby directing the received reflected light from the optical switch along the second optical output path to the sensing device for measurement, and
        changing from the second state to the first state after a first predetermined period of time,
    the controller further configured to respond to a second laser source firing signal by repeating the measurement sequence if the second laser source firing signal is received at the controller after the first predetermined period of time plus a second predetermined period of time, else ignoring the second laser source firing signal received at the controller.

2. The system of claim 1 where the optical switch is a Bragg cell.

3. The system of claim 1 where the sensing device is a microbolometer array.

4. The system of claim 1 where the controller determines the first predetermined time and the second predetermined time based on a duty cycle of the laser source.

5. The system of claim 1 where the light blocking element is a light block.

6. The system of claim 1 where the light blocking element is an area of the sensing device not used for measuring the received light.

7. The system of claim 1 where the light blocking element is an optical power sensor.

8. The system of claim 1 further comprising a focusing lens located on the optical input path.

9. The system of claim 1 further comprising a focusing lens located on the second optical output path.

10. A method for measuring light reflected from a target in a laser produced plasma extreme ultraviolet light source, the method comprising:

(a) receiving the reflected light at an optical switch;
(b) directing the received reflected light, by the optical switch, along a first optical output path from the optical switch to a light blocking element;
(c) receiving a first laser source firing signal at a controller;
(d) communicating, in response to the received first laser source firing signal, a signal from the controller to the optical switch to direct the received reflected light along a second optical output path from the optical switch to a sensing device;
(e) measuring the received reflected light by the sensing device;
(f) communicating, after a first predetermined period of time following step (d), a signal from the controller to the optical switch to direct the received reflected light along the first optical output path from the optical switch to the light blocking element; and
(g) receiving a second laser source firing signal at the controller and if the second laser source firing signal is received at the controller after the first predetermined period of time plus a second predetermined period of time, then repeating steps (d) through (f) wherein step (d) is in response to the second laser source firing signal, else ignoring the second laser source firing signal received at the controller.

11. The method of claim 10 where the optical switch is a Bragg cell.

12. The method of claim 10 where the sensing device is a microbolometer array.

13. The method of claim 10 where the controller determines the first predetermined time and the second predetermined time based on a duty cycle of the laser.

14. The method of claim 10 where the light blocking element is an optical block.

15. The method of claim 10 where the light blocking element is an optical power sensor.

16. The method of claim 10 further comprising focusing the received reflected light on the sensing device using a lens.

17. The method of claim 16 where the lens is located on the second optical output path.

18. The method of claim 16 where the lens is located on an optical input path from the target to the optical switch.

* * * * *